US012706444B2

(12) United States Patent
Onoe et al.

(10) Patent No.: US 12,706,444 B2
(45) Date of Patent: Aug. 11, 2026

(54) OPTICAL SEMICONDUCTOR DEVICE AND METHOD FOR PRODUCING SAME

(71) Applicant: Mitsubishi Electric Corporation, Tokyo (JP)

(72) Inventors: Kazuyuki Onoe, Tokyo (JP); Tsutomu Yamaguchi, Tokyo (JP); Yohei Hokama, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 514 days.

(21) Appl. No.: 18/546,692

(22) PCT Filed: Mar. 5, 2021

(86) PCT No.: PCT/JP2021/008601
§ 371 (c)(1),
(2) Date: Aug. 16, 2023

(87) PCT Pub. No.: WO2022/185508
PCT Pub. Date: Sep. 9, 2022

(65) Prior Publication Data
US 2024/0128724 A1 Apr. 18, 2024

(51) Int. Cl.
*H01S 5/227* (2006.01)
*H01S 5/042* (2006.01)
*H01S 5/22* (2006.01)

(52) U.S. Cl.
CPC ........ *H01S 5/2275* (2013.01); *H01S 5/04256* (2019.08); *H01S 5/2205* (2013.01)

(58) Field of Classification Search
CPC .. H01S 5/2275; H01S 5/04256; H01S 5/2205; H01S 5/3235; H01S 2301/176;
(Continued)

(56) References Cited

U.S. PATENT DOCUMENTS 4,852,111 A 7/1989 Hayakawa et al.
4,907,239 A 3/1990 Hayakawa et al.
(Continued)

FOREIGN PATENT DOCUMENTS

JP S56-066084 A 6/1981
JP S61-272989 A 12/1986
(Continued)

OTHER PUBLICATIONS

International Search Report issued in PCT/JP2021/008601; mailed May 18, 2021.
(Continued)

*Primary Examiner* — Jessica S Manno
(74) *Attorney, Agent, or Firm* — Studebaker Brackett PLLC

(57) ABSTRACT

An optical semiconductor device according to the present disclosure includes: a first-conductivity-type semiconductor substrate having a projecting portion; second-conductivity-type intermediate layers formed on both sides of the projecting portion above the semiconductor substrate; a stripe-shaped mesa structure formed of a first-conductivity-type first cladding layer, an active layer, and a second-conductivity-type second cladding layer, which are laminated above a surface including a top of the projecting portion so as to be centered at the projecting portion; buried layers formed on both sides of the mesa structure, to block current; and a second-conductivity-type contact layer formed at surfaces of the mesa structure and the buried layers.

6 Claims, 11 Drawing Sheets

(58) Field of Classification Search
CPC ... H01S 5/04254; H01S 5/2222; H01S 5/2232
See application file for complete search history.

(56) References Cited

U.S. PATENT DOCUMENTS

| | | | | |
|---|---|---|---|---|
| 4,939,743 | A | 7/1990 | Yamamoto | |
| 5,115,443 | A * | 5/1992 | Miyazawa | H10H 20/8242 372/45.01 |
| 2002/0145149 | A1 | 10/2002 | Kim et al. | |
| 2007/0091957 | A1 * | 4/2007 | Watatani | H01S 5/227 372/43.01 |
| 2008/0137702 | A1 | 6/2008 | Ae | |
| 2010/0047947 | A1 * | 2/2010 | Yashima | H01S 5/227 438/40 |
| 2011/0261848 | A1 | 10/2011 | Takeuchi | |
| 2015/0063391 | A1 * | 3/2015 | Takeuchi | H01S 5/3202 372/45.01 |
| 2020/0403380 | A1 | 12/2020 | Yamatoya et al. | |
| 2022/0294187 | A1 | 9/2022 | Onoe | |
| 2024/0154390 | A1 * | 5/2024 | Morikawa | H01S 5/2231 |

FOREIGN PATENT DOCUMENTS

| | | | | |
|---|---|---|---|---|
| JP | S63-150985 | A | 6/1988 | |
| JP | H01-291481 | A | 11/1989 | |
| JP | 2005-072526 | A | 3/2005 | |
| JP | 2008-172210 | A | 7/2008 | |
| JP | 2011-249767 | A | 12/2011 | |
| WO | WO-2005074047 | A1 * | 8/2005 | H01S 5/141 |
| WO | WO-2019208697 | A1 * | 10/2019 | H01S 5/34306 |
| WO | 2021/149190 | A1 | 7/2021 | |
| WO | WO-2021200548 | A1 * | 10/2021 | H01S 5/04254 |
| WO | WO-2022264347 | A1 * | 12/2022 | H01S 5/2226 |

OTHER PUBLICATIONS

"Notice of Reasons for Refusal" Office Action issued in JP 2021-545838; mailed by the Japanese Patent Office on Sep. 21, 2021.

An Office Action; mailed by the China National Intellectual Property Administration of the People's Republic of China on Mar. 18, 2026, which corresponds to Chinese Patent Application No. 202180094851.5 and is related to U.S. Appl. No. 18/546,692.

* cited by examiner

OPTICAL SEMICONDUCTOR DEVICE AND METHOD FOR PRODUCING SAME

TECHNICAL FIELD

The present disclosure relates to an optical semiconductor device and a method for producing the same.

BACKGROUND ART

In recent years, a data communication volume in a mobile communication system has been rapidly increasing, and the communication volume is expected to be enormous as a 5th-generation mobile communication system (5G) is introduced and spreads after the introduction. In order to process such an enormous data communication volume at high speed, high-speed operation of an optical communication module used in a communication device is essential. In order to achieve the high-speed operation, an optical semiconductor device such as a semiconductor laser which is a light source is also required to have higher performance.

As a semiconductor laser for optical communication, for example, FIG. 3 in Patent Document 1 discloses an element structure in which a mesa structure is buried with high-resistance semiconductor layers. In this element structure, thin p-type semiconductor layers are formed from side surfaces of the mesa structure to flat portions other than the mesa structure of a semiconductor substrate, and then the high-resistance semiconductor layers are formed to bury the mesa structure. Thus, providing the thin p-type semiconductor layers can suppress leak current. In addition, if the thickness of the p-type semiconductor layer is small enough, it is possible to reduce an element capacitance inevitably generated when the p-type semiconductor layer is formed.

Thus, the semiconductor laser disclosed in Patent Document 1 achieves high-performance operation in which the element capacitance can be reduced and the leak current can be suppressed, as desired for a light source of an optical communication module.

CITATION LIST

Patent Document

Patent Document 1: Japanese Laid-Open Patent Publication No. 2011-249767

SUMMARY OF THE INVENTION

Problem to be Solved by the Invention

However, in the semiconductor laser disclosed in Patent Document 1, at a first buried layer which is the p-type semiconductor layer covering the mesa structure and the flat portion, a part having a smaller layer thickness than other parts might be produced due to a transition plane formed at the time of epitaxial growth. Thus, the first buried layer becomes discontinuous, and this can lead to a problem such as increase in the leak current or increase in the element capacitance.

The present disclosure has been made to solve the above problem, and an object of the present disclosure is to provide an optical semiconductor device that operates with high efficiency and at high speed while enabling reduction in leak current and an element capacitance, and a method for producing the same.

Means to Solve the Problem

An optical semiconductor device according to the present disclosure includes: a first-conductivity-type semiconductor substrate having a projecting portion; second-conductivity-type intermediate layers formed on both sides of the projecting portion above the semiconductor substrate; a stripe-shaped mesa structure formed of a first-conductivity-type first cladding layer, an active layer, and a second-conductivity-type second cladding layer, which are laminated above a surface including a top of the projecting portion so as to be centered at the projecting portion; buried layers formed on both sides of the mesa structure, to block current; and a second-conductivity-type contact layer formed at surfaces of the mesa structure and the buried layers. A width between ends of the intermediate layers that contact with the projecting portion in a stripe width direction is greater than a width between ends of bottom portions of the mesa structure in the stripe width direction. The mesa structure has, on each of both sides thereof, a side surface along a direction perpendicular to a surface of the semiconductor substrate, a bottom portion on the intermediate layer side, and a slope surface connecting the side surface and the bottom portion. The buried layers are each formed of a second-conductivity-type or high-resistance first buried layer, a first-conductivity-type second buried layer, and a second-conductivity-type third buried layer, which are sequentially laminated on both sides of the mesa structure. A distance from a part at which a plane along the side surface of the mesa structure and a plane where the intermediate layer contacts with the first buried layer cross each other, to an end on a side where the intermediate layer contacts with the first buried layer, is not less than a distance obtained by multiplying a distance from the plane where the intermediate layer contacts with the first buried layer to an upper end of the active layer by 0.708.

An optical semiconductor device production method according to the present disclosure includes the steps of: forming a projecting portion on a semiconductor substrate through etching; epitaxially growing intermediate layers on both sides of the projecting portion; sequentially epitaxially growing a first-conductivity-type first cladding layer, an active layer, and a second-conductivity-type second cladding layer at surfaces of the projecting portion and the intermediate layers; forming, through etching, a stripe-shaped mesa structure whose center coincides with a center of the projecting portion and which is formed of the first cladding layer, the active layer, and the second cladding layer; epitaxially growing buried layers for blocking current, on both sides of the mesa structure; and epitaxially growing a second-conductivity-type contact layer at surfaces of the mesa structure and the buried layers. A width between ends of the intermediate layers that contact with the projecting portion in a stripe width direction is formed to be greater than a width between ends of bottom portions of the mesa structure in the stripe width direction. The mesa structure is formed to have, on each of both sides thereof, a side surface along a direction perpendicular to a surface of the semiconductor substrate, a bottom portion on the intermediate layer side, and a slope surface connecting the side surface and the bottom portion. The buried layers are each formed by three layers that are a second-conductivity-type or high-resistance first buried layer, a first-conductivity-type second buried layer, and a second-conductivity-type third buried layer, which are sequentially laminated on both sides of the mesa structure. A distance from a part at which a plane along the side surface of the mesa structure and a plane where the intermediate layer contacts with the first buried layer cross each other, to an end on a side where the intermediate layer contacts with the first buried layer, is not less than a distance obtained by multiplying a distance from the plane where the intermediate layer contacts with the first buried layer to an upper end of the active layer by 0.708.

Effect of the Invention

The optical semiconductor device according to the present disclosure includes the first-conductivity-type semiconductor substrate having the projecting portion, and the intermediate layers formed on both sides of the projecting portion, whereby leak current and an element capacitance can be reduced, thus providing an effect of obtaining an optical semiconductor device that operates with high efficiency and at high speed.

In the optical semiconductor device production method according to the present disclosure, the stripe-shaped projecting portion is formed on the first-conductivity-type semiconductor substrate through etching and the second-conductivity-type intermediate layers are formed on both sides of the projecting portion through selective growth by epitaxial growth, thus providing an effect that an optical semiconductor device that operates with high efficiency and at high speed can be easily produced.

DESCRIPTION OF EMBODIMENTS

Embodiment 1

Figure 1:
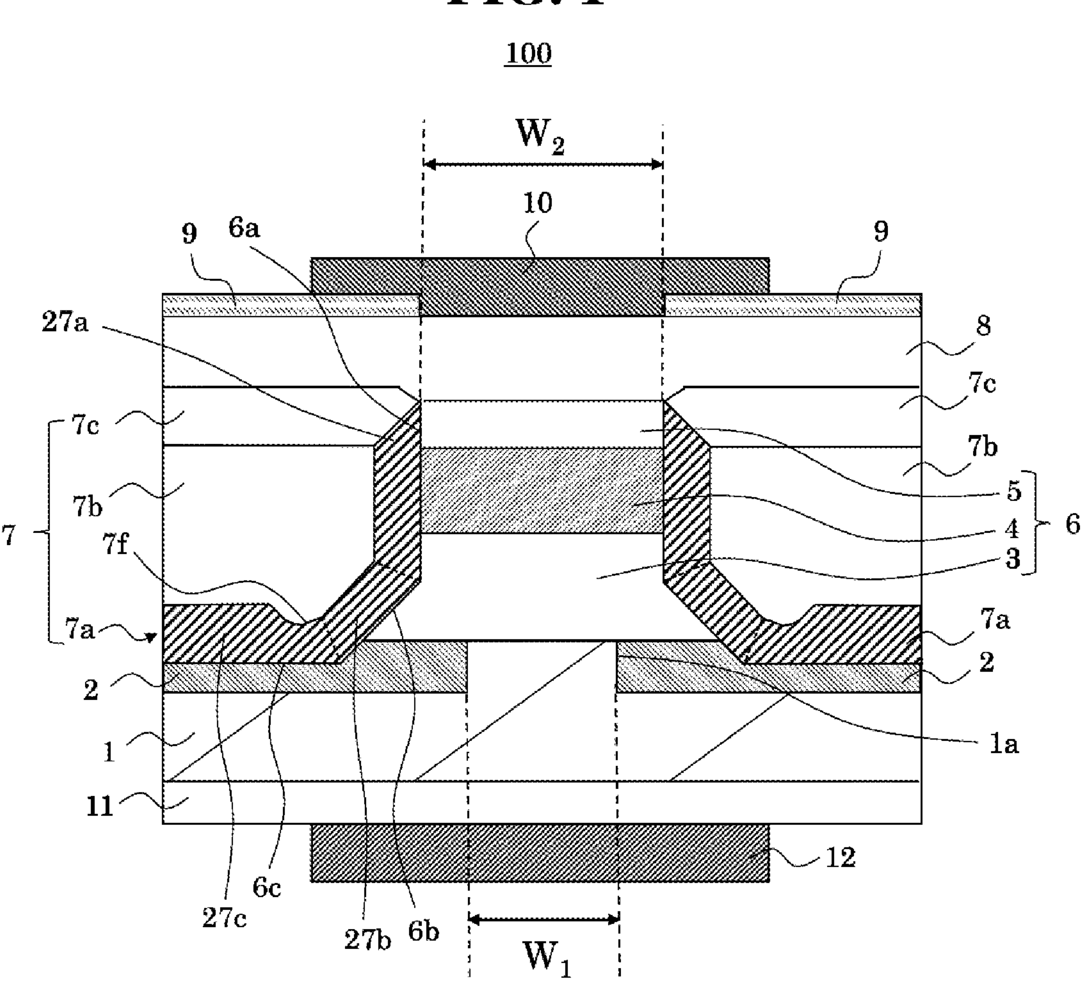
FIG. 1 is a sectional view showing the structure of an optical semiconductor device according to embodiment 1.

FIG. 1 is a sectional view showing the structure of an optical semiconductor device 100 according to embodiment 1.

The optical semiconductor device 100 is, for example, a semiconductor laser, and an example thereof is a buried-structure semiconductor laser. The buried-structure semiconductor laser may have a buried heterostructure.

The optical semiconductor device 100 includes: a first-conductivity-type semiconductor substrate 1 having a projecting portion 1*a*; second-conductivity-type intermediate layers 2 formed on both sides of the projecting portion 1*a* above the semiconductor substrate 1; a stripe-shaped mesa structure 6 formed of a first-conductivity-type first cladding layer 3, an active layer 4, and a second-conductivity-type second cladding layer 5, which are laminated above a surface including a top of the projecting portion 1*a* so as to be centered at the projecting portion 1*a*; buried layers 7 formed on both sides of the mesa structure 6 and each composed of three layers that are a second-conductivity-type first buried layer 7*a*, a first-conductivity-type second buried layer 7*b*, and a second-conductivity-type third buried layer 7*c*; a second-conductivity-type contact layer 8 formed at surfaces of the mesa structure 6 and the third buried layers 7*c*; a surface protection film 9 formed above the second-conductivity-type contact layer 8 and having an opening; a first electrode 10 contacting with a surface of the second-conductivity-type contact layer 8 via the opening of the surface protection film 9; and a second electrode 11 and a metal plating film 12 formed on the back surface side of the semiconductor substrate 1.

The first conductivity type and the second conductivity type described above may be p type and n type, respectively, or may be n type and p type, respectively.

The first-conductivity-type semiconductor substrate 1 is, for example, an n-type indium phosphide (InP) substrate. The second-conductivity-type intermediate layer is made from p-type InP, for example. The first-conductivity-type first cladding layer 3 is made from n-type InP, for example. The second-conductivity-type second cladding layer 5 is made from p-type InP, for example. The second-conductivity-type contact layer 8 is made from p-type InP, for example.

The active layer 4 has a strained multi-quantum well structure. This structure can achieve higher output and lower strain of the optical semiconductor device 100.

The first buried layer 7*a* composing the buried layer 7 is made from p-type InP, for example, and is doped with zinc (Zn) so that the conductivity type becomes p type. The second buried layer 7*b* is made from n-type InP, for example, and the third buried layer 7*c* is made from p-type InP, for example.

As shown in FIG. 1, the p-type first buried layer 7*a* is formed of three parts, i.e., a side surface portion 27*a* along a side surface 6*a* of the mesa structure 6, a flat portion 27*c* formed at a surface of the second-conductivity-type intermediate layer 2 along a bottom portion 6*c* of the mesa structure 6, and a slope portion 27*b* connecting the side surface portion 27*a* and the flat portion 27*c* along a slope surface 6*b* formed between the side surface 6*a* and the bottom portion 6*c* of the mesa structure 6. The side surface portion 27*a* extends to the same height as an upper surface of the second cladding layer 5 and has a tapered shape at the upper end.

Hereinafter, the width of the projecting portion 1*a* in the stripe width direction is referred to as a width $W_1$. In addition, the width between the side surfaces 6*a* on both sides of the mesa structure 6 is referred to as a mesa width $W_2$, and the width between ends of the bottom portions 6*c* from which the bottom portions 6*c* extend on both sides of the mesa structure 6 is also referred to as a bottom portion width of the mesa structure 6.

The center in the stripe width direction of the mesa structure 6 and the center in the stripe width direction of the projecting portion 1*a* coincide with each other or substantially coincide with each other. The sectional shape of the projecting portion 1*a* is a rectangular shape. The width $W_1$ of the projecting portion 1*a* is set in advance so as to be smaller than the mesa width $W_2$ of the mesa structure 6.

It is desirable that the layer thickness of the flat portion 27*c* of the p-type first buried layer 7*a* is not less than two times the layer thickness of the side surface portion 27*a*. The reason is as follows.

Of leak current flowing in the p-type first buried layer 7*a* with respect to injected current of the entire optical semiconductor device 100, in particular, the ratio of leak current flowing in the side surface portion 27*a* covering the side surface of the active layer 4 is proportional to the sectional area of the p-type first buried layer 7*a*. Therefore, of the p-type first buried layer 7*a*, if the side surface portion 27*a* covering the side surface of the active layer 4 is thinned, leak current can be reduced.

However, if the p-type first buried layer 7*a* is excessively thinned, leak current might increase on the contrary. Therefore, of the p-type first buried layer 7*a*, in particular, controlling the side surface portion 27*a* covering the side surface of the active layer 4 to have an optimum layer thickness is very important for high efficiency and stable operation of the optical semiconductor device 100.

In the optical semiconductor device 100 according to embodiment 1, the layer thickness of the flat portion 27*c* is set to be not less than two times the layer thickness of the side surface portion 27*a*. If the layer thickness of the flat portion 27*c* is less than two times the layer thickness of the side surface portion 27*a*, when the side surface portion 27*a* is excessively thinned, the layer thickness of the flat portion 27*c* is also thinned at the same time, so that particularly a problem of increasing leak current becomes significant due to a part having a relatively small layer thickness because of formation of a transition plane 7*f* described later.

Figure 2A:
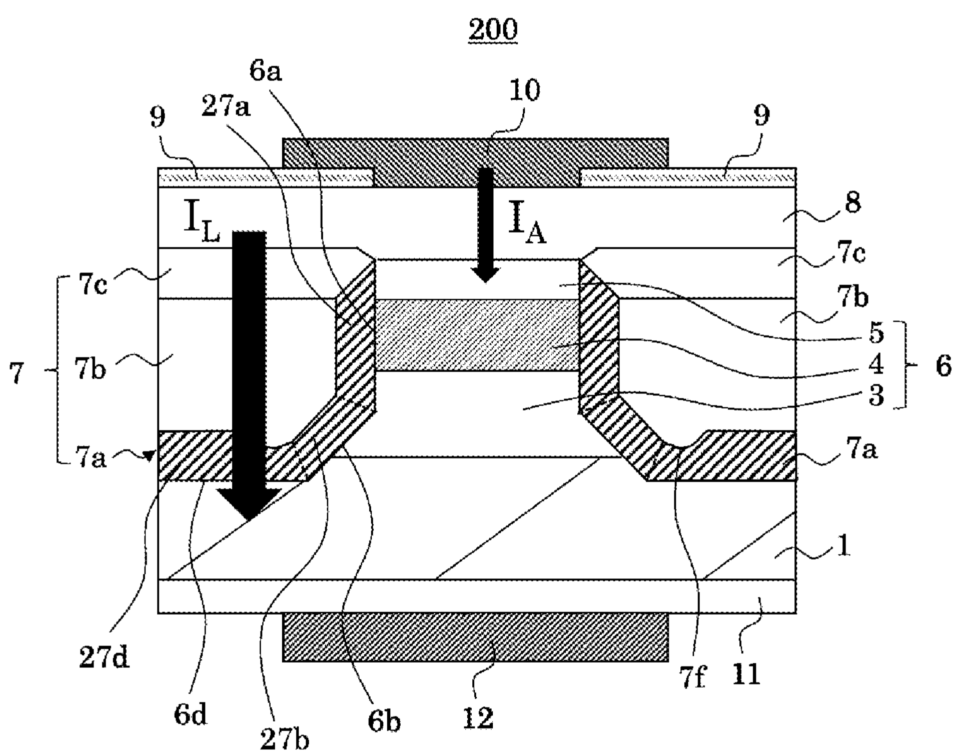
FIG. 2A is a sectional view showing the structure of an optical semiconductor device in a comparative example.
Figure 2B:
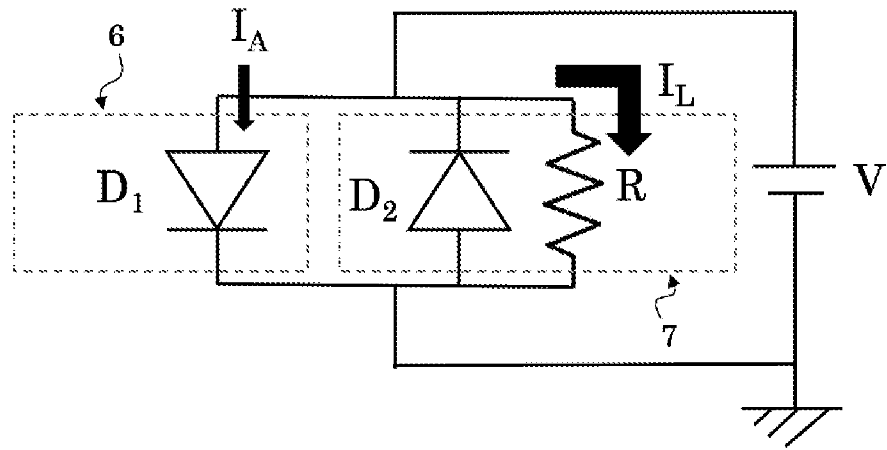
FIG. 2B shows an equivalent circuit of the optical semiconductor device in the comparative example.

Before describing operation of the optical semiconductor device 100 according to embodiment 1, first, an optical semiconductor device 200 which is a comparative example will be described. FIG. 2A is a sectional view showing the structure of the optical semiconductor device 200 in the comparative example, and FIG. 2B shows an equivalent circuit of the mesa structure 6 and the buried layer 7 in the optical semiconductor device 200. In FIG. 2B, the first conductivity type is n type, and the second conductivity type is p type. The optical semiconductor device 200 in the comparative example is not provided with the second-conductivity-type intermediate layer 2 as in the optical semiconductor device 100 according to embodiment 1.

The mesa structure 6 part including the active layer 4 forms, in terms of an equivalent circuit, a diode $D_1$ as shown in the equivalent circuit diagram in FIG. 2B. That is, a p-n junction diode $D_1$ is formed by the n-type first cladding layer 3, the active layer 4, and the p-type second cladding layer 5.

On the other hand, in the buried layer 7 part, a p-n junction diode $D_2$ is formed by the p-type first buried layer 7*a* and the n-type second buried layer 7*b*, and in addition, the buried layer 7 itself is represented as a resistor R.

In the equivalent circuit diagram shown in FIG. 2B, the anode of the diode $D_1$ and the cathode of the diode $D_2$ are connected, and the cathode of the diode $D_1$ and the anode of the diode $D_2$ are connected. The resistor R of the buried layer 7 is connected in parallel to the diode $D_1$ and the diode $D_2$.

For causing the optical semiconductor device 200 to emit a laser beam, the positive side of a DC power supply V and the first electrode 10 which is a front-surface electrode are electrically connected, the negative side of the DC power supply V and the second electrode 11 which is a back-surface electrode are electrically connected via the metal plating film 12, and voltage is applied by the DC power supply V. With voltage applied by the DC power supply V, voltage is applied in the forward bias direction to the diode $D_1$ which equivalently represents the mesa structure 6. Thus, current $I_A$ injected from the first electrode 10 of the optical semiconductor device 200 flows through the p-type contact layer 8 to the mesa structure 6, so that a laser beam is produced in the active layer 4.

On the other hand, in the diode $D_2$ and the resistor R which equivalently represent the buried layer 7, the above voltage applied by the DC power supply V is applied in the reverse bias direction. Thus, current does not flow in the diode $D_2$ part of the buried layer 7, and flows only in the resistor R part as leak current $I_L$.

The resistance value of the resistor R is originally high, and therefore, owing to the high resistance, the leak current $I_L$ is at a negligible level. That is, the buried layer 7 serves as a current block layer. As a result, current injected in the optical semiconductor device 200 flows being concentrated in the mesa structure 6 owing to a current confinement effect by the buried layers 7 provided on both sides of the mesa structure 6 and serving as current block layers. Thus, the optical semiconductor device 200 is originally able to emit a laser beam with high efficiency with respect to injected current owing to the current confinement effect by the buried layers 7.

However, in the optical semiconductor device 200 in the comparative example, when the p-type first buried layers 7*a* which are first layers formed as the buried layers 7 are formed on both sides of the mesa structure 6 through epitaxial growth, the layer thickness is not uniform over the entire area and thus parts having relatively small layer thicknesses, i.e., transition planes 7*f*, are likely to be formed.

As is found from FIG. 2A, the p-type first buried layer 7*a* of the optical semiconductor device 200 in the comparative example is formed of three parts, i.e., the side surface portion 27*a* along the side surface 6*a* of the mesa structure 6, a flat portion 27*d* along a bottom portion 6*d* of the mesa structure 6, and the slope portion 27*b* along the slope surface 6*b* connecting the side surface portion 27*a* and the flat portion 27*d*. The transition plane 7*f* of the p-type first buried layer 7*a* is likely to be formed at a flat portion 27*d* part close to the slope portion 27*b*.

Hereinafter, the mechanism of formation of the transition plane 7*f* and a problem caused by the transition plane 7*f* will be described, using an optical semiconductor device made from an InP material as an example.

The plane orientation of the side surface 6*a* of the mesa structure 6 is a (110) plane. The plane orientation of the upper surface of the bottom portion 6*d* of the mesa structure 6 is a (001) plane.

In epitaxial growth of the buried layer 7, when the p-type InP first buried layer 7*a* which is the first layer is formed, epitaxial growth on a (001) plane corresponding to the bottom portion 6*d* of the mesa structure 6 and epitaxial growth of p-type InP on a (110) plane corresponding to the side surface 6*a* of the mesa structure 6, progress simultaneously.

In epitaxial growth of the p-type InP first buried layer 7*a*, a phenomenon called migration occurs, so that epitaxial growth on a (111)B plane also occurs. Both of the (111)B plane and the (001) plane are plane orientations in which the p-type InP first buried layer 7*a* is readily epitaxially grown. A part where such planes exhibiting high growth speeds cross each other forms the transition plane 7*f*.

At the transition plane 7*f*, crystal growth materials, i.e., In and P, are taken to the (111)B plane side and the (001) plane side, so that the p-type InP first buried layer 7*a* is less grown. As a result, the layer thickness of the p-type InP first buried layer 7*a* at the transition plane 7*f* becomes relatively small as compared to other parts.

When the influence of the transition plane 7*f* is great, the p-type InP first buried layer 7*a* might become discontinuous at a transition plane 7*f* part, and this causes a problem of connecting the n-type InP semiconductor substrate 1 and the n-type InP second buried layer 7*b*.

In order to reduce the influence of the transition plane 7*f*, it is conceivable to increase the layer thickness of the p-type InP first buried layer 7*a*. However, if the layer thickness of the p-type InP first buried layer 7*a* is merely increased, there might be a problem that the thickness of the n-type InP second buried layer 7*b* laminated next to the p-type InP first buried layer 7*a* cannot be ensured. In a case where the thickness of the n-type InP second buried layer 7*b* cannot be ensured, the element capacitance increases, thus causing a problem of obstructing speed increase of the optical semiconductor device.

Thus, the mechanism of formation of the transition plane 7*f* and the problem caused by the transition plane 7*f* are as described above.

As described above, at the transition plane 7*f* of the p-type InP first buried layer 7*a*, the effective resistance is reduced and this might cause a problem that a component of leak current $I_L$ passing through the small-layer-thickness part increases to a level not negligible. In the equivalent circuit, the above increase of the leak current results in reduction in the resistor R shown in FIG. 2B, and this causes reduction in efficiency in laser operation of the optical semiconductor device 200. Further, increase in the leak current $I_L$ also causes increase in the element capacitance.

As a method for preventing increase in leak current due to the transition plane 7*f* of the p-type InP first buried layer 7*a*, a method of increasing the layer thickness of the p-type InP first buried layer 7*a* may be conceivable as described above, but in order that the buried layer 7 having a three-layer structure stably exhibits a function as a current block layer, in the p-type InP first buried layer 7*a*, the layer thickness of the side surface portion 27*a* formed at the side surface 6*a* of the mesa structure 6, in particular, the side surface of the active layer 4, and the layer thickness of the flat portion 27*d* on the bottom portion 6*d* side of the mesa structure 6, need to be formed stably and in a well-balanced manner. For the above reason, there is a problem that the layer thickness of the p-type InP first buried layer 7*a* cannot be merely increased.

In the optical semiconductor device 100 according to embodiment 1, the second-conductivity-type intermediate layer 2 is provided in order to solve the problem that the leak current and the element capacitance increase in the optical semiconductor device 200 in the comparative example. Hereinafter, the function of the second-conductivity-type intermediate layer 2 will be described.

As described in detail in the method for producing the optical semiconductor device 100 according to embodiment 1 later, the second-conductivity-type intermediate layers 2 are formed separately from the second-conductivity-type first buried layers 7*a* which can cause increase in the leak current $I_L$, and therefore, even if parts having a relatively small layer thickness are produced due to formation of the transition planes 7*f* when the second-conductivity-type first buried layers 7*a* are formed on both sides of the mesa structure 6, the thicknesses of second-conductivity-type layers are increased as a whole with the second-conductivity-type intermediate layers 2 provided. Thus, the problem due to non-uniformity of the layer thickness of the first buried layer 7*a*, which is caused in the comparative example, is solved. Hereinafter, with reference to the equivalent circuit shown in FIG. 2B, description will be given in more detail.

In the optical semiconductor device 100 according to embodiment 1, the second-conductivity-type intermediate layer 2 having the same conductivity type as the second-conductivity-type first buried layer 7*a* is provided on the first-conductivity-type semiconductor substrate 1 side with respect to the second-conductivity-type first buried layer 7*a*.

Therefore, when the equivalent circuit shown in FIG. 2B is applied to the optical semiconductor device 100 according to embodiment 1, the diode $D_2$ representing the buried layer 7 is formed to be a p-n junction diode $D_2$ by the n-type second buried layer 7*b* and a p-type layer formed of the p-type intermediate layer 2 and the p-type first buried layer 7*a*, in the optical semiconductor device 100 according to embodiment 1.

In other words, it can be said that the second-conductivity-type first buried layer 7*a* is reinforced by the intermediate layer 2 having the same second conductivity type. Therefore, even if a part having a relatively small layer thickness, i.e., the transition plane 7*f*, is present in the second-conductivity-type first buried layer 7*a*, the second-conductivity-type layer is effectively thickened by the layer thickness of the second-conductivity-type intermediate layer 2 provided on the semiconductor substrate 1 side, thus providing an effect of preventing production of a part having a relatively small layer thickness which can cause the leak current $I_L$. In addition, since the leak current $I_L$ flowing in the buried layer 7 is reduced, the element capacitance can also be reduced.

In the optical semiconductor device 100 according to embodiment 1, the width $W_1$ in the stripe width direction of the projecting portion 1*a* whose sectional shape along the stripe width direction is a rectangular shape is set to be smaller than the mesa width $W_2$ of the mesa structure 6, as shown in the sectional view in FIG. 1. That is, the width $W_1$ between the ends of the second-conductivity-type intermediate layers 2 that contact with the projecting portion 1*a* in the stripe width direction is smaller than the mesa width $W_2$ of the mesa structure 6.

In terms of current confinement, it can be said that the opening width $W_1$ between the second-conductivity-type intermediate layers 2 for blocking flow of current is set to be smaller than the mesa width $W_2$ of the mesa structure 6. Thus, current flowing through the mesa structure 6 is subjected to further current confinement by the second-conductivity-type intermediate layers 2 having the opening width $W_1$.

That is, in the optical semiconductor device 100 according to embodiment 1, a current confinement effect by the buried layers 7 and a current confinement effect by the second-conductivity-type intermediate layers 2 are synergistically exerted, thus providing an effect of further improving efficiency of the optical semiconductor device 100.

In addition, with the second-conductivity-type intermediate layer 2 provided, the leak current $I_L$ flowing in the buried layer 7 can be reduced, so that the element capacitance is also reduced, thus providing an effect of enabling high-speed operation of the optical semiconductor device 100 as well.

Next, the method for producing the optical semiconductor device 100 according to embodiment 1 will be described with reference to FIG. 3 to FIG. 15. In the following description, an InP-based crystal material is shown as a specific example of the material forming the optical semiconductor device 100. However, the crystal material forming the optical semiconductor device 100 according to embodiment 1 is not limited to an InP-based material. As long as the crystal material can form the optical semiconductor device, the optical semiconductor device production method described below can be applied in the same manner, by selecting, for example, a dry etching gas material or the like so as to be optimum for dry etching of the crystal material.

First, above the n-type InP semiconductor substrate 1, a $SiO_2$ film 20*a* to be a mask 20 in selective growth by epitaxial growth is formed. As a method for forming the $SiO_2$ film 20*a*, for example, plasma chemical vapor deposition (CVD) may be used.

Figure 3:
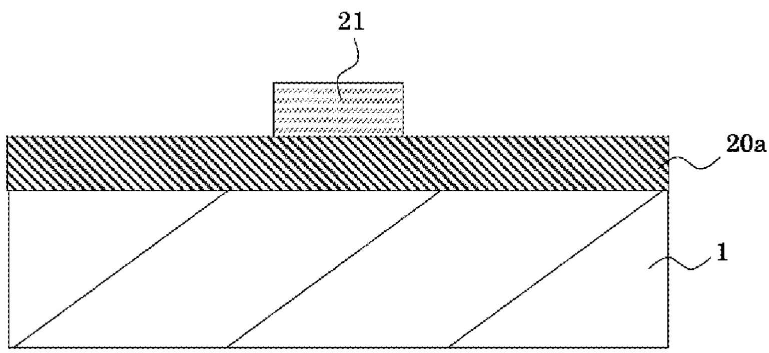
FIG. 3 is a sectional view showing an optical semiconductor device production method according to embodiment 1.

With a photoresist applied on the $SiO_2$ film 20*a*, a stripe-shaped photoresist mask 21 as shown in FIG. 3 is formed using photolithography and etching. The photoresist mask 21 serves as an etching mask for forming the $SiO_2$ film 20*a* into a stripe-shaped mask 20.

Figure 4:
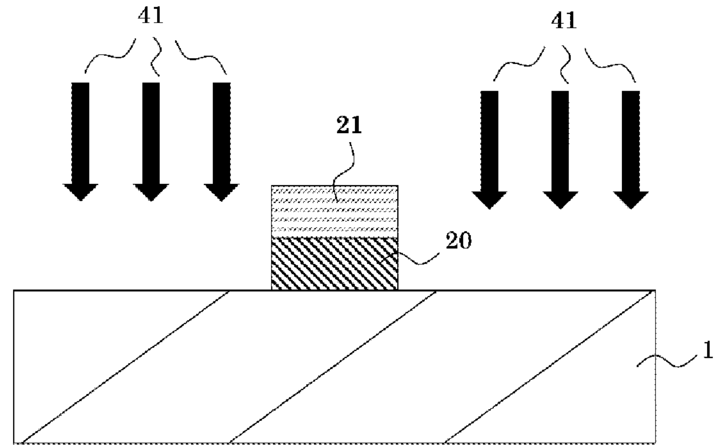
FIG. 4 is a sectional view showing the optical semiconductor device production method according to embodiment 1.

Using the photoresist mask 21 as an etching mask, the $SiO_2$ film 20*a* is dry-etched to be worked into the stripe-shaped mask 20 formed of the $SiO_2$ film as shown in FIG. 4. As a dry etching method, for example, plasma dry etching may be used. An example of an etching gas 41 for dry etching is a fluorine-based gas such as $SF_6$/He gas.

After the dry etching, the photoresist mask 21 is removed. At the part where the $SiO_2$ film 20*a* is removed through dry etching, the n-type InP semiconductor substrate 1 is exposed.

Using the stripe-shaped mask 20 formed of the $SiO_2$ film as an etching mask, the n-type InP semiconductor substrate 1 is dry-etched. A specific example of an etching gas 42 for dry etching is a methane-based gas or a chlorine-based gas.

Figure 5:
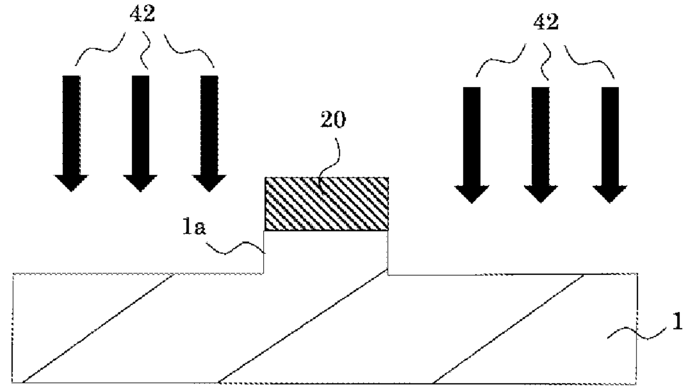
FIG. 5 is a sectional view showing the optical semiconductor device production method according to embodiment 1.
Figure 6:
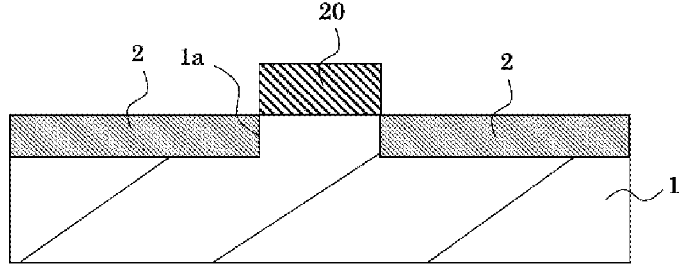
FIG. 6 is a sectional view showing the optical semiconductor device production method according to embodiment 1.

The depth to which the n-type InP semiconductor substrate 1 is dry-etched is, for example, 400 nm. FIG. 5 shows a cross-section after the dry etching.

Through the dry etching, the stripe-shaped projecting portion 1*a* is formed on the n-type InP semiconductor substrate 1. Here, the stripe-shaped projecting portion 1*a* refers to a projecting structure which is formed to extend in the direction along a waveguide, i.e., the mesa structure 6 described later, and whose cross-section along a direction perpendicular to the waveguide, i.e., along the stripe width direction, has a rectangular shape.

The height from the flat surface of the n-type InP semiconductor substrate 1 to the top of the projecting portion 1*a* is the same as the depth to which n-type InP has been removed through dry etching. That is, in the aforementioned example, the height is 400 nm.

Using the stripe-shaped mask 20 formed of the $SiO_2$ film as a selective growth mask, selective growth by epitaxial growth is performed to form the p-type InP intermediate layers 2 on both sides of the projecting portion 1*a* above the n-type InP semiconductor substrate 1. An example of the epitaxial growth is metal organic chemical vapor deposition (MOCVD).

In the selective growth, a crystal layer, i.e., an InP layer, is not formed above the stripe-shaped mask 20 formed of the $SiO_2$ film. That is, the p-type InP intermediate layers 2 are epitaxially grown above the flat surfaces of the n-type InP semiconductor substrate 1. Thus, as shown in the sectional view in FIG. 6, both sides of the projecting portion 1*a* are buried with the p-type InP intermediate layers 2.

Figure 7:
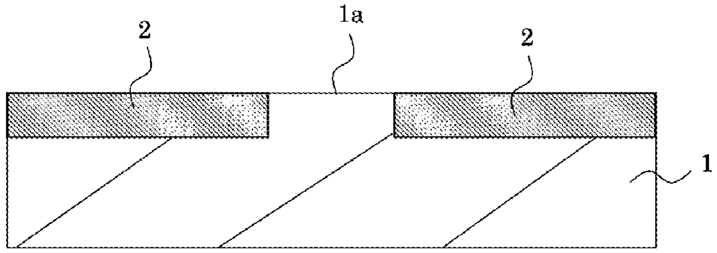
FIG. 7 is a sectional view showing the optical semiconductor device production method according to embodiment 1.

After the selective growth of the p-type InP intermediate layers 2, the stripe-shaped mask 20 formed of the $SiO_2$ film is removed through dry etching. FIG. 7 shows a sectional view after the mask 20 is removed. The surface of the projecting portion 1*a* and the surfaces of the p-type InP intermediate layers 2 are continuous so as to form one flat surface as a whole.

Figure 8:
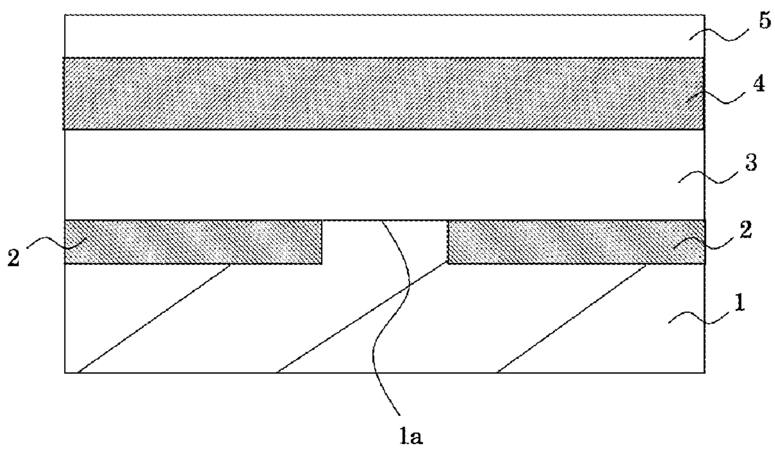
FIG. 8 is a sectional view showing the optical semiconductor device production method according to embodiment 1.

After the mask 20 is removed, by MOCVD, the n-type InP first cladding layer 3, the active layer 4, and the p-type InP second cladding layer 5 are sequentially epitaxially grown above the surface formed by the top of the projecting portion 1*a* and the surfaces of the p-type InP intermediate layers 2. FIG. 8 is a sectional view after the epitaxial growth.

Figure 9:
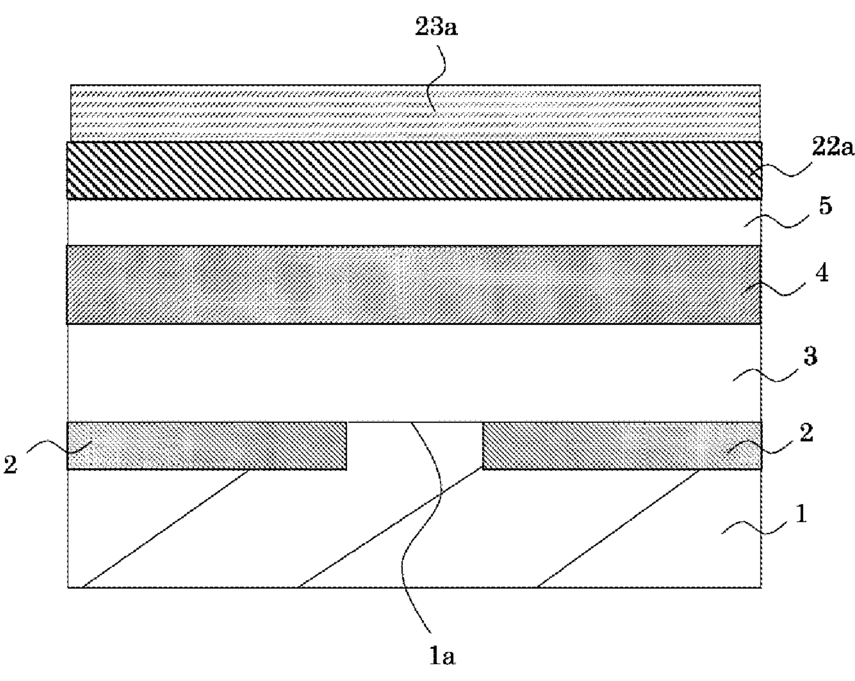
FIG. 9 is a sectional view showing the optical semiconductor device production method according to embodiment 1.

A $SiO_2$ film 22*a* is formed on the surface of the p-type InP second cladding layer 5. As a method for forming the $SiO_2$ film 22*a*, for example, plasma CVD may be used. A photoresist film 23*a* is applied on the $SiO_2$ film 22*a*. FIG. 9 is a sectional view showing the state in which the $SiO_2$ film 22*a* and the photoresist film 23*a* are formed.

Figure 10:
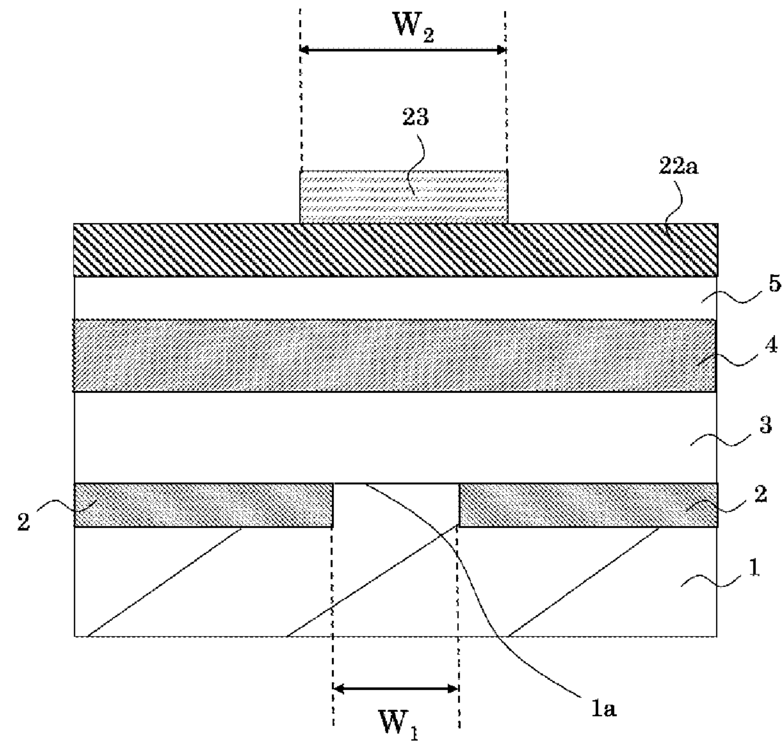
FIG. 10 is a sectional view showing the optical semiconductor device production method according to embodiment 1.

Using photolithography and etching, a stripe-shaped photoresist mask 23 as shown in FIG. 10 is formed. The photoresist mask 23 serves as an etching mask for forming the $SiO_2$ film 22*a* into a stripe-shaped mask 22.

The position of the photoresist mask 23 is adjusted so that the center in the stripe width direction of the photoresist mask 23 and the center in the stripe width direction of the projecting portion 1*a* coincide with each other or substantially coincide with each other. In addition, the width $W_2$ of the projecting portion 1*a* in the stripe width direction is set to be smaller than the stripe width $W_2$ of the photoresist mask 23.

Figure 11:
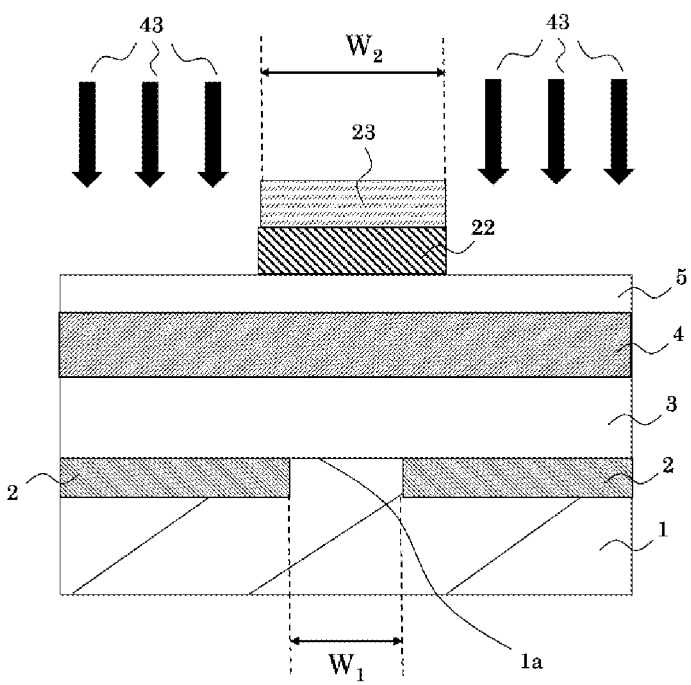
FIG. 11 is a sectional view showing the optical semiconductor device production method according to embodiment 1.

Using the stripe-shaped photoresist mask 23 as an etching mask, the $SiO_2$ film 22*a* is dry-etched to be worked into the stripe-shaped mask 22 formed of the $SiO_2$ film as shown in FIG. 11. An example of an etching gas 43 for dry etching is a fluorine-based gas. At the part where the $SiO_2$ film 22*a* is removed through dry etching, the p-type InP second cladding layer 5 is exposed. After the dry etching, the photoresist mask 23 is removed.

Figure 12:
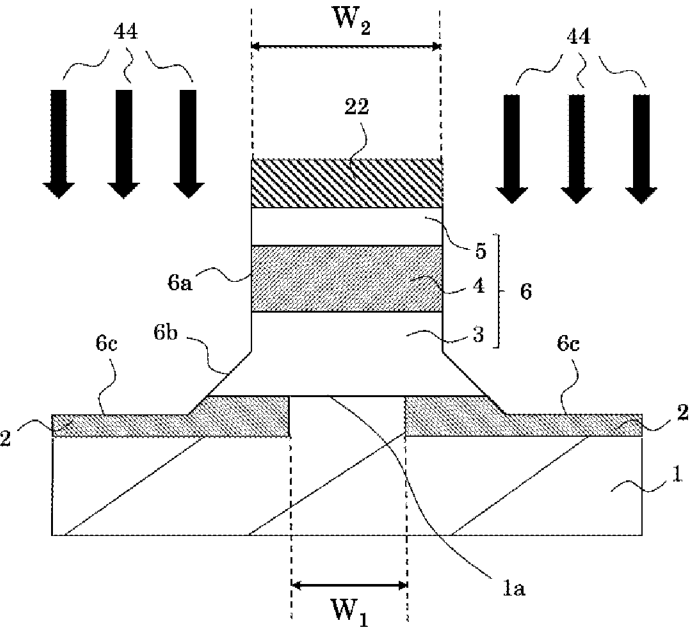
FIG. 12 is a sectional view showing the optical semiconductor device production method according to embodiment 1.

Using the stripe-shaped mask 22 formed of the $SiO_2$ film as an etching mask, the p-type InP second cladding layer 5, the active layer 4, and the n-type InP first cladding layer 3 are dry-etched, and further, parts of the p-type InP intermediate layers 2 are dry-etched, thereby forming the mesa structure 6 as shown in the sectional view in FIG. 12. A specific example of an etching gas 44 for dry etching is a methane-based gas or a chlorine-based gas.

In the above dry etching for the mesa structure 6, the slope surfaces 6*b* are formed on the bottom portion sides of the side surfaces 6*a* of the mesa structure 6. Also, in buried growth of the buried layers 7 by epitaxial growth described later, when the temperature is increased before the growth, formation of the slope surfaces 6*b* is promoted through migration.

The depth to which the p-type InP intermediate layers 2 are dry-etched is, for example, 200 nm. Since the layer thickness of the p-type InP intermediate layer 2 before dry etching is 400 nm, the halves of the p-type InP intermediate layers 2 are removed in the layer thickness direction through the dry etching.

The center in the stripe width direction of the mesa structure 6 and the center in the stripe width direction of the projecting portion 1*a* coincide with each other or substantially coincide with each other. The mesa structure 6 is formed by dry-etching, into a stripe shape, the n-type InP first cladding layer 3, the active layer 4, and the p-type InP second cladding layer 5 laminated above the surface including the top of the projecting portion 1*a*.

The mesa width of the mesa structure 6 after dry etching is almost the same width $W_2$ as the stripe width of the photoresist mask 23. This is because, owing to the nature of dry etching, the width $W_2$ is kept also on the etching-target side when the crystal layer is dry-etched. As a result, the width $W_1$ of the projecting portion 1*a* in the stripe width direction becomes smaller than the mesa width $W_2$ of the mesa structure 6.

As shown in FIG. 12, the mesa structure 6 formed through dry etching has, on each of both sides of the mesa structure 6, three surfaces that are the side surface 6*a* along a direction perpendicular to the surface of the n-type InP semiconductor substrate 1, the surface of the p-type InP intermediate layer 2 exposed by dry etching, i.e., the bottom portion 6*c* of the mesa structure 6, and the slope surface 6*b* connecting the side surface 6*a* and the bottom portion 6*c* of the mesa structure 6.

After the mesa structure 6 is formed, using the stripe-shaped mask 22 formed of the $SiO_2$ film as a selective growth mask, buried growth is performed in regions on both sides of the mesa structure 6 having the above surfaces. As a crystal growth method for the buried growth, the aforementioned MOCVD is preferable. By MOCVD, first, the p-type InP first buried layers 7*a* which are the first layers of the buried layers 7 each formed of three layers are epitaxially grown.

Figure 13:
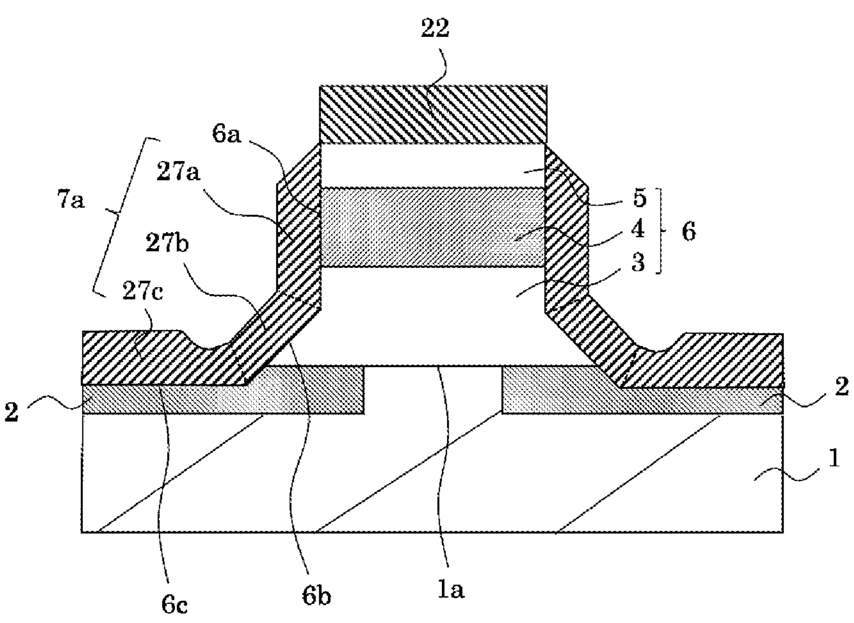
FIG. 13 is a sectional view showing the optical semiconductor device production method according to embodiment 1.
Figure 14:
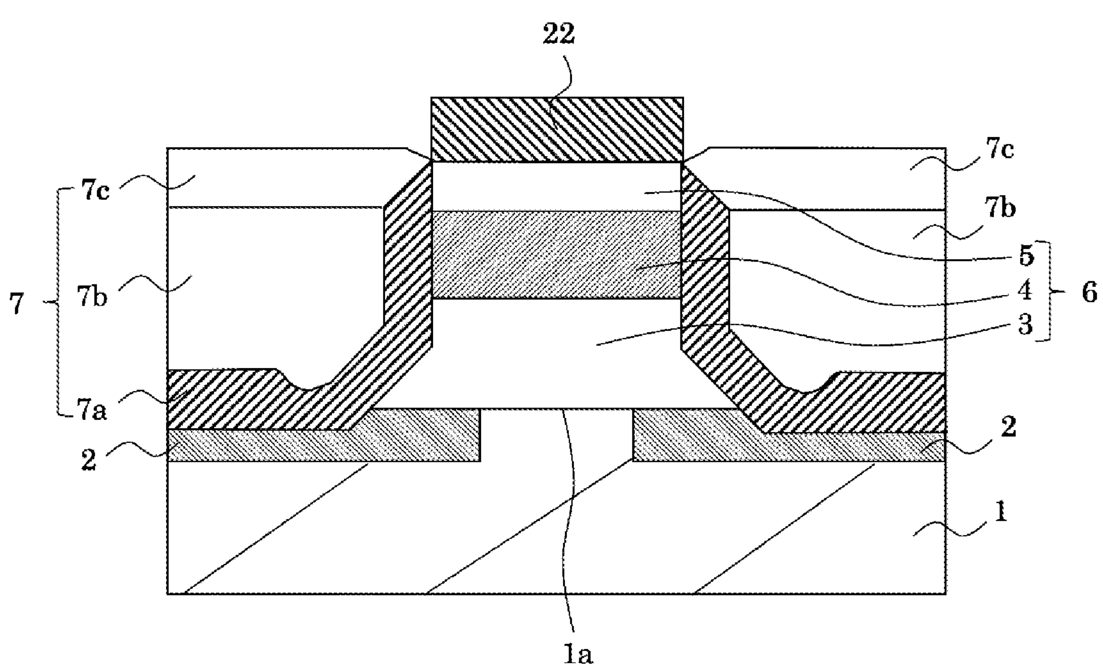
FIG. 14 is a sectional view showing the optical semiconductor device production method according to embodiment 1.

As shown in FIG. 13 which is a sectional view after the p-type InP first buried layers 7*a* are formed, the p-type InP first buried layers 7*a* are formed with the shape of the mesa structure 6 reflected and thus are each composed of three parts that are the side surface portion 27*a* along the side surface 6*a* of the mesa structure 6, the flat portion 27*c* along the surface of the p-type InP intermediate layer 2, i.e., the bottom portion 6*c* of the mesa structure 6, and the slope portion 27*b* connecting the side surface portion 27*a* and the flat portion 27*c* along the slope surface 6*b*.

Subsequent to the p-type InP first buried layers 7*a*, the n-type InP second buried layers 7*b* and the p-type InP third buried layers 7*c* are sequentially laminated through epitaxial growth. As shown in a sectional view in FIG. 14, through epitaxial growth of the buried layers 7 each formed of three layers sequentially laminated, both sides of the mesa structure 6 are buried with the buried layers 7, so that the surface of the mesa structure 6 and the surfaces of the buried layers 7 form an almost flat surface.

Figure 15:
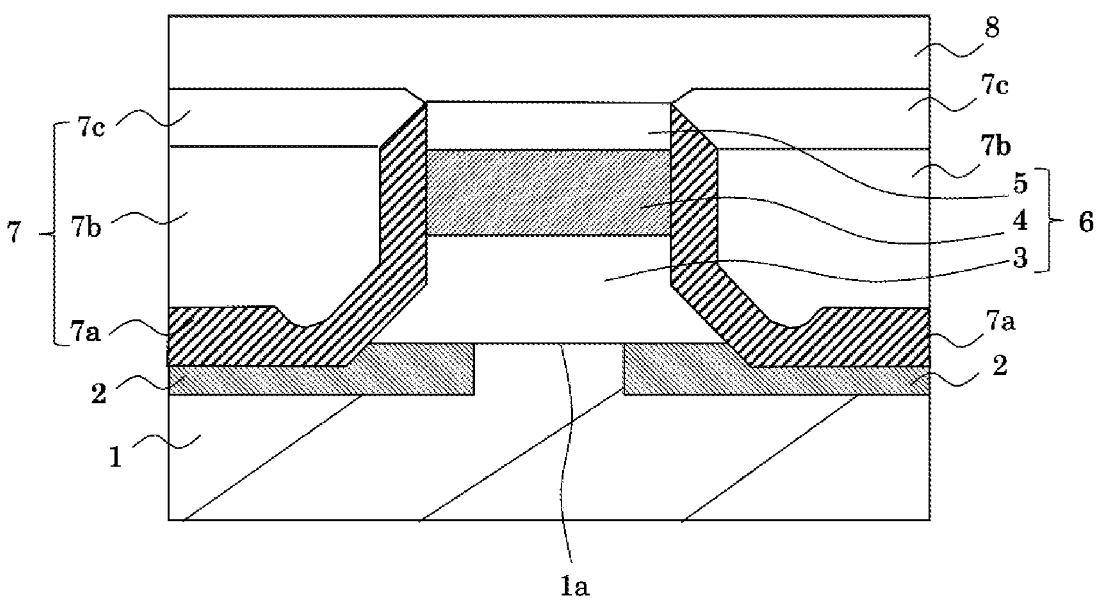
FIG. 15 is a sectional view showing the optical semiconductor device production method according to embodiment 1.

After epitaxial growth of the buried layers 7, the stripe-shaped mask 22 formed of the $SiO_2$ film is removed through dry etching. With the mask 22 removed, above the surfaces of the p-type InP second cladding layer 5 forming the surface of the mesa structure 6 and the p-type InP third buried layers 7*c* forming the surfaces of the buried layers 7, the p-type InP contact layer 8 is epitaxially grown by MOCVD. FIG. 15 is a sectional view after the p-type InP contact layer 8 is formed. The p-type InP contact layer 8 serves to allow current to efficiently flow inside the optical semiconductor device 100 from the first electrode 10.

After all the epitaxial growth, the surface protection film 9 having an opening is formed on the surface of the p-type InP contact layer 8, and further, the first electrode 10 is formed to be electrically connected by contacting with the p-type InP contact layer 8 via the opening of the surface protection film 9. The surface protection film 9 serves to reduce a parasitic capacitance and protect the semiconductor layers.

After working on the front surface side of the n-type InP semiconductor substrate 1 is finished, the second electrode 11 and the metal plating film 12 are formed on the back surface side of the n-type InP semiconductor substrate 1, whereby the optical semiconductor device 100 as shown in the sectional view in FIG. 1 is completed.

In the method for producing the optical semiconductor device 100 according to embodiment 1, using the mask 20 as an etching mask, the stripe-shaped projecting portion 1*a* is formed on the first-conductivity-type semiconductor substrate 1 through dry etching, and using the mask 20 as a selective growth mask, the second-conductivity-type intermediate layers 2 are formed on both sides of the projecting portion 1*a* through selective growth by epitaxial growth, thus providing an effect that the optical semiconductor device 100 that operates with high efficiency and at high speed can be easily produced.

As described above, the optical semiconductor device 100 according to embodiment 1 includes the first-conductivity-type semiconductor substrate 1 having the projecting portion 1*a*, and the intermediate layers 2 formed on both sides of the projecting portion 1*a* and having an opening width smaller than the mesa width, whereby the leak current and the element capacitance can be reduced, thus providing an effect of obtaining the optical semiconductor device that operates with high efficiency and at high speed.

Embodiment 2

Figure 16:
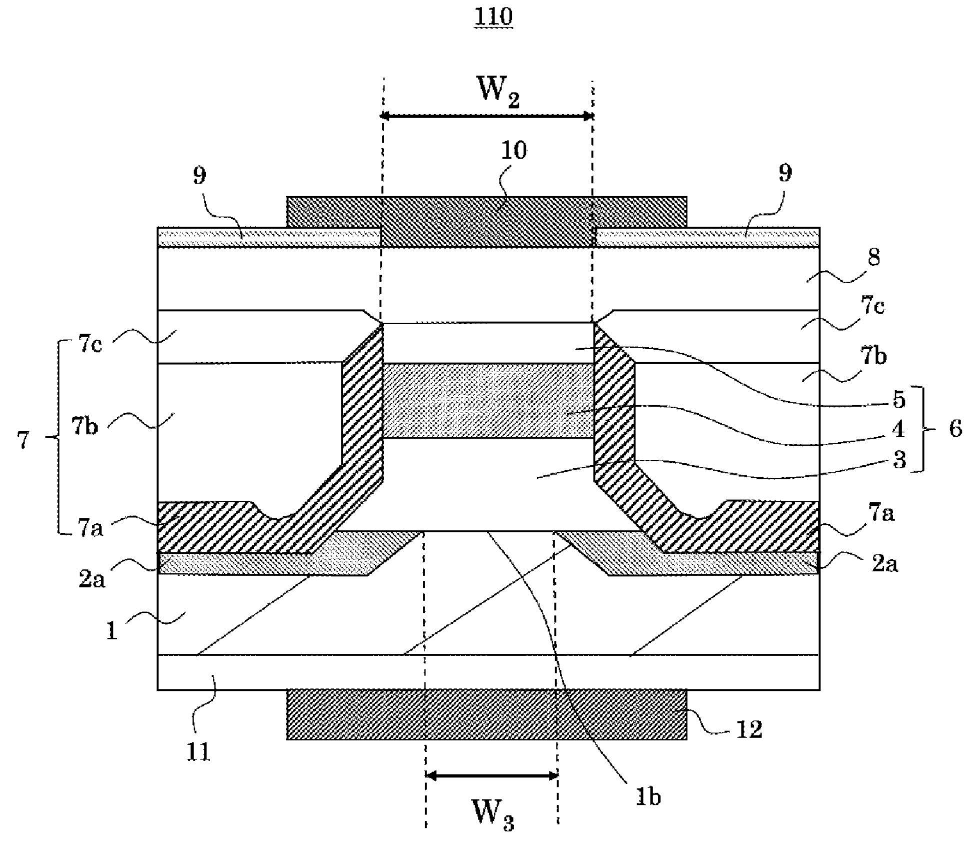
FIG. 16 is a sectional view showing the structure of an optical semiconductor device according to embodiment 2.

FIG. 16 shows a sectional view of an optical semiconductor device 110 according to embodiment 2. As a structural difference from the optical semiconductor device 100 according to embodiment 1, the optical semiconductor device 110 according to embodiment 2 is configured such that the sectional shape along the stripe width direction of a projecting portion 1*b* is not a rectangular shape but a trapezoidal shape.

Figure 17:
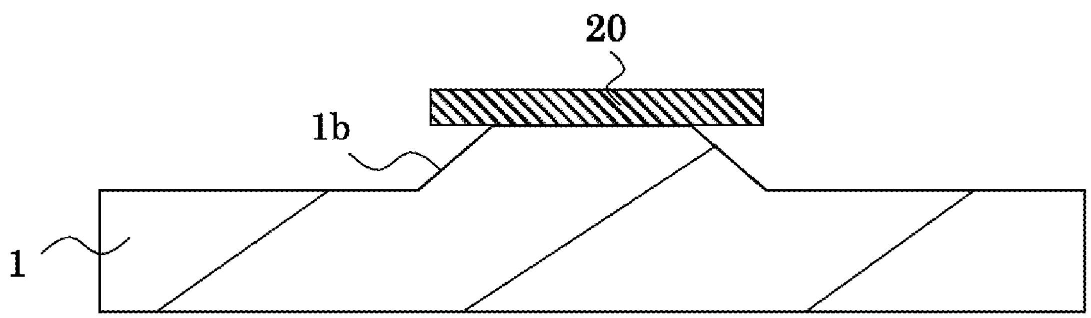
FIG. 17 is a sectional view showing an optical semiconductor device production method according to embodiment 2.
Figure 18:
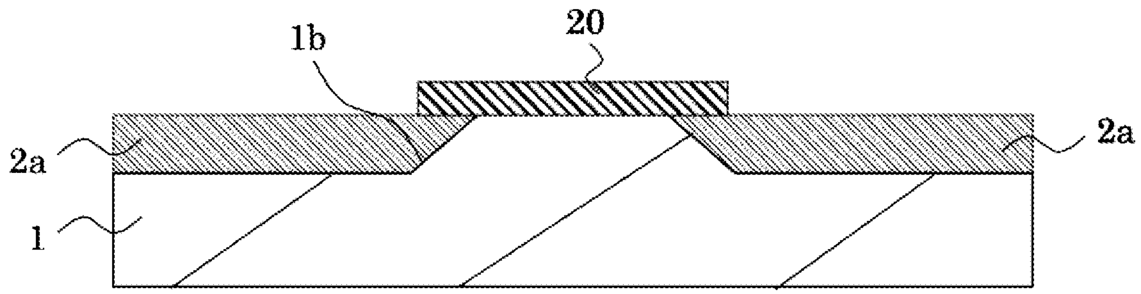
FIG. 18 is a sectional view showing the optical semiconductor device production method according to embodiment 2.

FIG. 17 and FIG. 18 show a characteristic process in the method for producing the optical semiconductor device 110 according to embodiment 2.

The process until the stripe-shaped mask 20 formed of the $SiO_2$ film is formed above the first-conductivity-type semiconductor substrate 1 as shown in FIG. 4 is the same as the method for producing the optical semiconductor device 100 according to embodiment 1.

Using the mask 20 as an etching mask, the first-conductivity-type semiconductor substrate 1 is wet-etched. Through the wet etching, working is performed so that side surfaces of the projecting portion 1*b* have a forward mesa shape as shown in a sectional view in FIG. 17. As a result of the wet etching, the sectional shape along the stripe width direction of the projecting portion 1*b* becomes a trapezoidal shape.

Using the mask 20 as a selective growth mask, second-conductivity-type intermediate layers 2*a* are formed on both sides of the projecting portion 1*b* through selective growth by epitaxial growth. An example of the epitaxial growth is MOCVD. A specific example of the second-conductivity-type intermediate layer 2*a* is a p-type InP intermediate layer 2*a*.

In the selective growth, while a crystal layer is not formed above the mask 20, epitaxial growth occurs also under the mask 20. Therefore, as shown in a sectional view in FIG. 18, both sides of the projecting portion 1*b* whose cross-section has a trapezoidal shape are buried with the second-conductivity-type intermediate layers 2*a*.

After the selective growth of the second-conductivity-type intermediate layers 2*a*, the mask 20 is removed through dry etching. The production process after the mask 20 is removed is the same as in the method for producing the optical semiconductor device 100 according to embodiment 1 as shown in FIG. 8 to FIG. 15.

In the optical semiconductor device 110 according to embodiment 2, the sectional shape of the projecting portion 1*b* is made into a trapezoidal shape, whereby, in a case where a width $W_3$ of the top of the projecting portion 1*b* in the stripe width direction is the same as the width $W_1$ of the rectangular-shaped projecting portion 1*a* of the optical semiconductor device 100 according to embodiment 1, in the optical semiconductor device 110 according to embodiment 2, since the projecting portion 1*b* spreads in a trapezoidal shape from its top located on the bottom portion side of the mesa structure 6 toward the back surface side of the semiconductor substrate 1, current flowing in the mesa structure 6 leads to the second electrode 11 through a region having a wider sectional area. That is, the sectional area of the region where current flows increases, thus providing an effect that the effective element resistance is reduced as compared to the case of the rectangular-shaped projecting portion 1*a* in embodiment 1. Meanwhile, the current confinement effect is determined by the width $W_3$ of the top of the trapezoidal-shaped projecting portion 1*b* and therefore is equivalent to that of the optical semiconductor device 100 according to embodiment 1.

As described above, in the optical semiconductor device 110 according to embodiment 2, the sectional shape along the stripe width direction of the projecting portion 1*b* of the first-conductivity-type semiconductor substrate 1 is a trapezoidal shape, whereby an effect that the element resistance can be reduced is also provided in addition to the effects provided by the optical semiconductor device according to embodiment 1.

Embodiment 3

Figure 19:
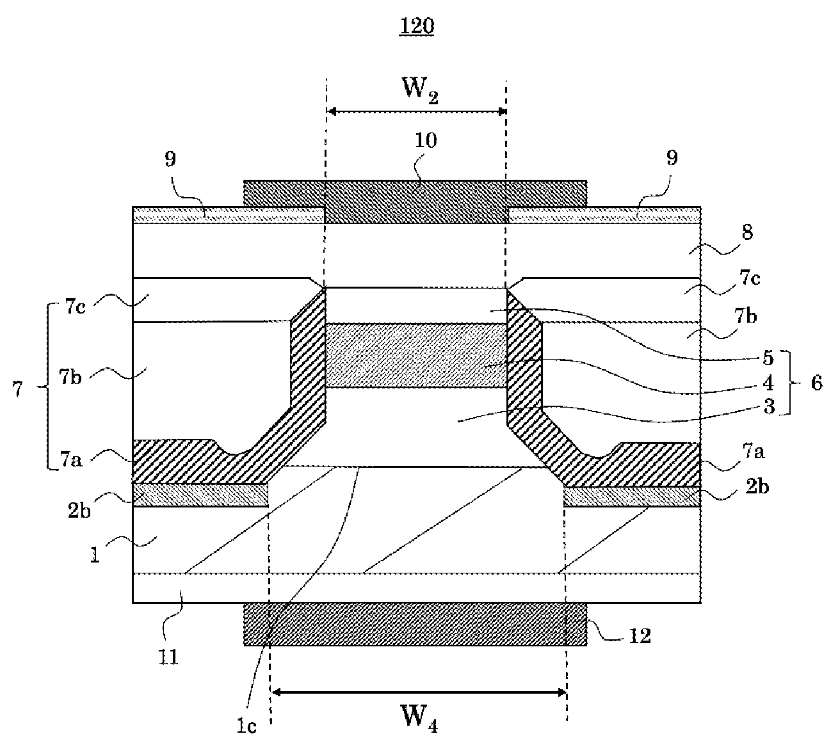
FIG. 19 is a sectional view showing the structure of an optical semiconductor device according to embodiment 3.

FIG. 19 shows a sectional view of an optical semiconductor device 120 according to embodiment 3. As a structural difference from the optical semiconductor device 100 according to embodiment 1, the optical semiconductor device 120 according to embodiment 3 is configured such that a width $W_4$ of a projecting portion 1*c* in the stripe width direction is the same as or substantially the same as the width between contact parts of the bottom portions 6*c* of the mesa structure 6, i.e., the width between the ends of the bottom portions 6*c* of the mesa structure 6.

In the optical semiconductor device 120 according to embodiment 3, since the width $W_4$ of the projecting portion 1*c* coincides with the width between the ends of the bottom portions 6*c* of the mesa structure 6, the current confinement effect by second-conductivity-type intermediate layers 2*b* does not occur. The width of the top of the projecting portion 1*c* is smaller than the width $W_4$ of the projecting portion 1*c*. This is because corners of the top of the projecting portion 1*c* are removed when the mesa structure 6 is formed through dry etching. Therefore, the width $W_4$ of the projecting portion 1*c* refers to the width of a part of the projecting portion 1*c* other than the part whose corners are removed so as to form parts of the slope surfaces 6*b* of the mesa structure 6.

In the optical semiconductor device 100 according to embodiment 1, if the layer thickness of the projecting portion 1*a* is increased in order to more effectively prevent occurrence of leak current due to production of a part having a relatively small layer thickness due to the transition plane 7*f* formed at the second-conductivity-type first buried layer 7*a*, since the width $W_1$ of the projecting portion 1*a* in the stripe width direction is smaller than the mesa width $W_2$ of the mesa structure 6, the distance that current flows in a region having a narrower sectional area increases relative to current flowing in the mesa structure 6, so that the element resistance of the optical semiconductor device 100 increases to a certain extent.

On the other hand, in the optical semiconductor device 120 according to embodiment 3, since the width $W_4$ of the projecting portion 1*c* is greater than the mesa width $W_2$ of the mesa structure 6, the element resistance becomes small. Therefore, it becomes possible to design the layer thicknesses of the second-conductivity-type intermediate layers 2*b* so as to more effectively prevent leak current from the second-conductivity-type first buried layers 7*a*, while reducing the element resistance. That is, an effect of increasing the degree of freedom in designing of the layer thicknesses of the second-conductivity-type intermediate layers 2*b*, is provided.

The optical semiconductor device 100 according to embodiment 1 needs to be configured such that the center in the stripe width direction of the mesa structure 6 coincides with the center in the stripe width direction of the projecting portion 1*a*. Then, if these centers are shifted from each other, the current distribution in the stripe width direction in the active layer 4 might be biased with respect to the center, and the bias of the current distribution might adversely affect the element property. Therefore, in order to produce the optical semiconductor device 100 according to embodiment 1 with a high yield, production technology having high accuracy to a certain extent is needed.

On the other hand, in the optical semiconductor device 120 according to embodiment 3, the width $W_4$ of the projecting portion 1*c* is greater than the mesa width $W_2$ of the mesa structure 6 as described above. Therefore, even if the center of the projecting portion 1*c* is shifted to a certain extent relative to the center of the bottom portions 6*c* of the mesa structure 6, the current distribution is not influenced, so that the element property is not adversely affected. Thus, an effect that the optical semiconductor device can be more easily produced is provided.

As described above, in the optical semiconductor device 120 according to embodiment 3, since the width $W_4$ of the projecting portion 1*c* is set to be the same as the width between the ends of the bottom portions 6*c* of the mesa structure 6, the width $W_4$ of the projecting portion 1*c* is greater than the mesa width $W_2$, and the degree of freedom in designing of the layer thicknesses of the second-conductivity-type intermediate layers 2*b* is increased. Therefore, while the leak current is small, the element resistance becomes smaller and production technology having high accuracy is not needed, thus providing an effect of obtaining the optical semiconductor device that can operate with high efficiency and at high speed and that can be more easily produced.

Embodiment 4

Figure 20:
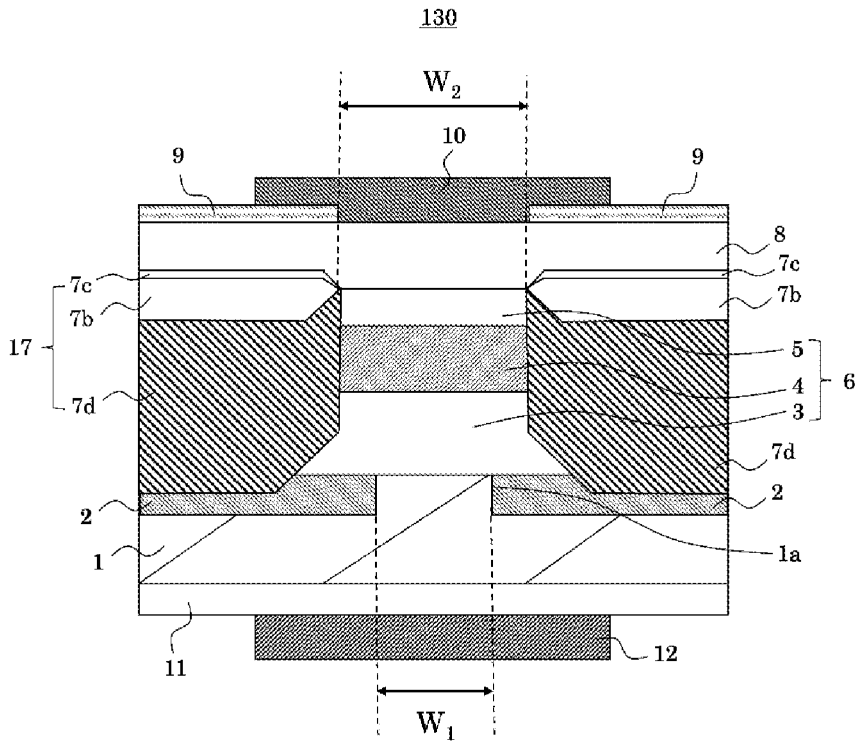
FIG. 20 is a sectional view showing the structure of an optical semiconductor device according to embodiment 4.

FIG. 20 shows a sectional view of an optical semiconductor device 130 according to embodiment 4. As a structural difference from the optical semiconductor device 100 according to embodiment 1, the optical semiconductor device 130 according to embodiment 4 is configured such that, of buried layers 17 formed on both sides of the mesa structure 6, first buried layers 7*d* are formed of high-resistance semiconductor layers, instead of a second-conductivity-type crystal material, e.g., a conductive crystal material such as p-type InP.

An example of the high-resistance semiconductor layer forming the first buried layer 7*d* is a crystal layer doped with impurities such as iron. A specific example thereof is a semi-insulating InP material doped with iron.

By applying the first buried layer 7*d* which is a high-resistance semiconductor layer as the first layer of the buried layer 17, an effect that leak current caused at the buried layer 17 is further reduced is provided. In addition, since the leak current is further reduced, the element capacitance can also be reduced. Not only the first buried layer 7*d* but also the intermediate layer 2 may be formed of a high-resistance semiconductor layer.

As described above, in the optical semiconductor device 130 according to embodiment 4, the first buried layer 7*d* which is a high-resistance semiconductor layer is applied as the first layer of the buried layer 17, whereby the leak current and the element capacitance can be further reduced, thus providing an effect of obtaining the optical semiconductor device that operates with high efficiency and at high speed.

Embodiment 5

Figure 21:
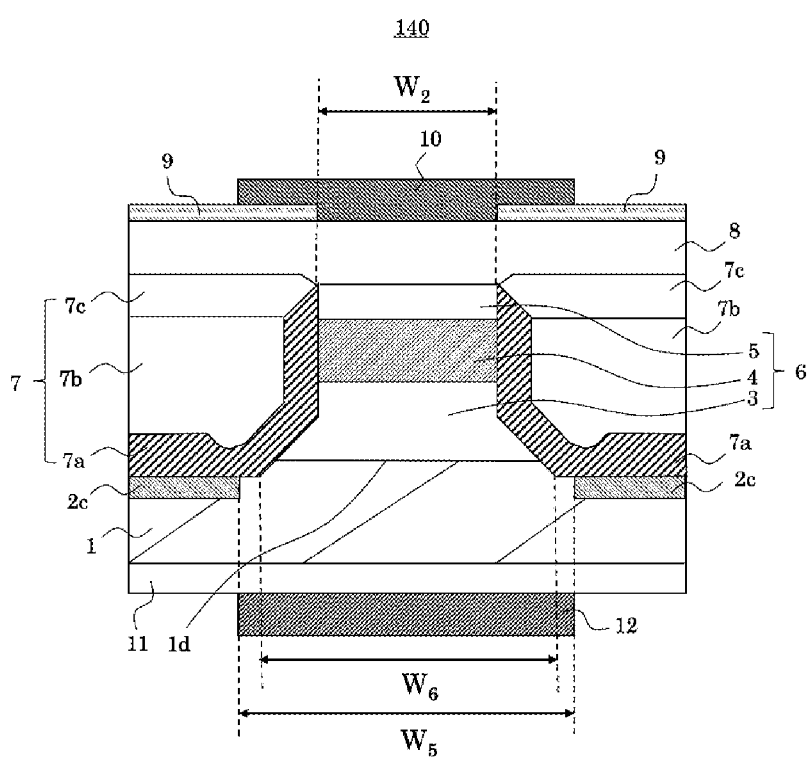
FIG. 21 is a sectional view showing the structure of an optical semiconductor device according to embodiment 5.

FIG. 21 shows a sectional view of an optical semiconductor device 140 according to embodiment 5. As a structural difference from the optical semiconductor device 120 according to embodiment 3, the optical semiconductor device 140 according to embodiment 5 is configured such that a width $W_5$ between the ends, of second-conductivity-type intermediate layers 2*c* provided on both sides of the mesa structure 6, that contact with a projecting portion 1*d* of the first-conductivity-type semiconductor substrate 1 is greater than a width $W_6$ between contact parts of the bottom portions 6*c* of the mesa structure 6, i.e., the width $W_6$ between the ends of the bottom portions 6*c* of the mesa structure 6.

In the optical semiconductor device 140 according to embodiment 5, as described above, the width $W_5$ between the ends, of the second-conductivity-type intermediate layers 2*c* provided on both sides of the mesa structure 6, that contact with the side surfaces of the projecting portion 1*d* of the first-conductivity-type semiconductor substrate 1 is set in advance to be greater than the width $W_6$ between the ends of the bottom portions 6*c* of the mesa structure 6.

With this configuration adopted, even if production error occurs when the optical semiconductor device is produced, and the center of the width $W_5$ corresponding to the opening width of the second-conductivity-type intermediate layers 2*c* is shifted to a certain extent relative to the center of the mesa structure 6 due to the production error, the element property is not adversely affected, thus providing an effect that the optical semiconductor device can be more easily produced.

In the optical semiconductor device 140 according to embodiment 5, the ends, of the second-conductivity-type intermediate layers 2*c*, that contact with the projecting portion 1*d* of the first-conductivity-type semiconductor substrate 1 are located more distant from the center of the mesa structure 6 than the parts where the slope surfaces 6*b* and the bottom portions 6*c* of the mesa structure 6 contact with each other. Therefore, when the layer thicknesses of the second-conductivity-type intermediate layers 2*c* are changed, the influence on the element resistance of the optical semiconductor device 140 is very small. Thus, the degree of freedom in designing of the layer thicknesses of the second-conductivity-type intermediate layers 2*c* is further increased.

Thus, in the optical semiconductor device 140 according to embodiment 5, with the above structure adopted, the degree of freedom in designing of the layer thicknesses of the second-conductivity-type intermediate layers 2*c* is further increased, so that the element resistance becomes smaller and the leak current and the element capacitance are reduced, thus providing an effect of obtaining the optical semiconductor device that can operate with high efficiency and at high speed and that can be more easily produced because production technology having high accuracy is not needed.

Embodiment 6

Figure 22:
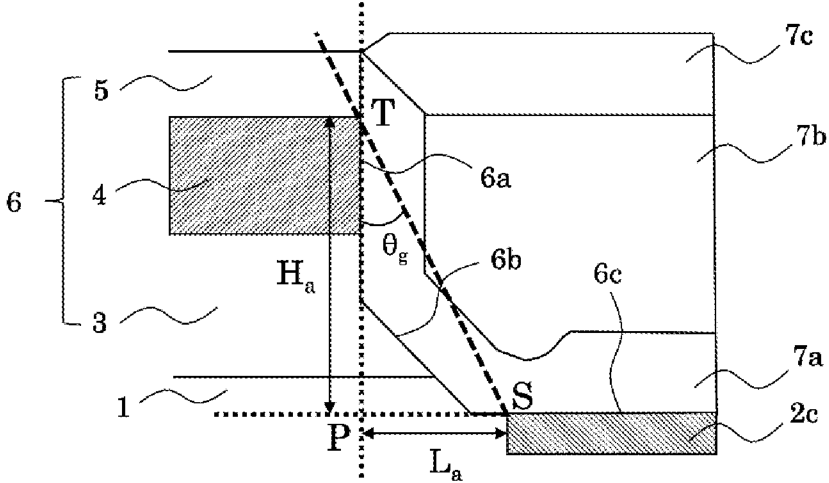
FIG. 22 is a sectional view showing a major part of the structure of an optical semiconductor device according to embodiment 6.

FIG. 22 shows an enlarged view of a major part of an optical semiconductor device according to embodiment 6. The optical semiconductor device according to embodiment 6 has the same layer configuration as the optical semiconductor device 140 according to embodiment 5, but has the following feature.

In FIG. 22, P is defined as a part at which a plane formed by extending, toward the mesa structure 6 side, a plane where the second-conductivity-type intermediate layer 2*c* contacts with the second-conductivity-type first buried layer 7*a*, and a plane formed by extending the side surface 6*a* of the mesa structure 6 toward the first-conductivity-type semiconductor substrate 1 side, cross each other. In addition, S is defined as a corner of a plane where the end of the second-conductivity-type intermediate layer 2*c* contacts with the second-conductivity-type first buried layer 7*a*, and T is defined as a corner, on the second-conductivity-type second cladding layer 5 side, where the active layer 4 contacts with the side surface 6*a* of the mesa structure 6.

Further, $L_a$ is defined as the length between P and S, i.e., the distance from the end of the second-conductivity-type intermediate layer 2*c* to the plane extended from the side surface 6*a* of the mesa structure 6, $H_a$ is defined as the length between T and P, i.e., the height (distance) from the plane where the second-conductivity-type intermediate layer 2*c* contacts with the second-conductivity-type first buried layer 7*a* to the upper end of the active layer 4, i.e., the plane where the active layer 4 contacts with the second-conductivity-type second cladding layer 5, and $\theta_g$ is defined as an angle formed by a segment TS and a segment TP shown in FIG. 22. Then, the angle $\theta_g$ is represented by the following Expression (1).

$$L_a = H_a \cdot \tan(\theta_g) \quad (1)$$

In the optical semiconductor device according to embodiment 6, the distance $L_a$ and the height (distance) $H_a$ are set such that the angle $\theta_g$ is not less than 35.3°. The reason for this setting of the angle $\theta_g$ is as follows. From the corner S of the plane where the end of the second-conductivity-type intermediate layer 2*c* contacts with the second-conductivity-type first buried layer 7*a*, a dislocation might extend in each epitaxially growing layer along the crystal plane. Even in this case, if the angle $\theta_g$ is not less than 35.3°, the dislocation starting from the corner S extends toward a higher position than T which is the position of the upper end of the active layer 4. Thus, the dislocation is not produced inside the active layer 4.

If a dislocation is produced inside the active layer 4, reliability of the optical semiconductor device is significantly lost. However, in the optical semiconductor device according to embodiment 6, the distance $L_a$ and the height (distance) $H_a$ are set in advance such that the angle $\theta_g$ is not less than 35.3°, whereby a reliable optical semiconductor device can be obtained.

When $\theta_g$ is set to 35.3°, tan ($\theta_g$) is tan (35.3°). Since tan (35.3°) is 0.708, the distance $L_a$ and the height (distance) $H_a$ are set in advance so as to satisfy the following Expression (2).

$$L_a \geq 0.708 H_a \quad (2)$$

The above description is summarized as follows: the distance $L_a$ from the part at which the plane along the side surface 6*a* of the mesa structure 6 and the plane where the second-conductivity-type intermediate layer 2*c* contacts with the second-conductivity-type first buried layer 7*a* cross each other, to the end on the side where the second-conductivity-type intermediate layer 2*c* contacts with the second-conductivity-type first buried layer 7*a*, is not less than a distance obtained by multiplying the height (distance) $H_a$ from the plane where the second-conductivity-type intermediate layer 2*c* contacts with the second-conductivity-type first buried layer 7*a* to the upper end of the active layer 4 by 0.708.

Thus, in the optical semiconductor device according to embodiment 6, with the above structure adopted, an effect of obtaining a more reliable optical semiconductor device is provided in addition to the effects provided by the optical semiconductor device 140 according to embodiment 5.

The optical semiconductor device according to each embodiment 1 to 6 described above is, for example, an InP-based long-wavelength semiconductor laser for a wavelength of 1.3 to 1.55 μm used as a light source for optical communication. By using such a semiconductor laser, it becomes possible to reduce loss in a silica optical fiber.

In embodiments 1 to 6, as a specific example of the optical semiconductor device, a semiconductor laser has been described. This semiconductor laser includes a modulator integrated semiconductor laser (electro-absorption modulator integrated laser diode; EML). The optical semiconductor device according to each embodiment 1 to 6 is applicable also to an electro-absorption (EA) part of the EML. The optical semiconductor device according to each embodiment 1 to 6 may be applied to all various optical semiconductor devices.

Although the disclosure is described above in terms of various exemplary embodiments and implementations, it should be understood that the various features, aspects, and functionality described in one or more of the individual embodiments are not limited in their applicability to the particular embodiment with which they are described, but instead can be applied, alone or in various combinations to one or more of the embodiments of the disclosure.

It is therefore understood that numerous modifications which have not been exemplified can be devised without departing from the scope of the present disclosure. For example, at least one of the constituent components may be modified, added, or eliminated. At least one of the constituent components mentioned in at least one of the preferred embodiments may be selected and combined with the constituent components mentioned in another preferred embodiment.

DESCRIPTION OF THE REFERENCE CHARACTERS

1 semiconductor substrate
1*a*, 1*b*, 1*c*, 1*d* projecting portion
2, 2*a*, 2*b*, 2*c* intermediate layer
3 first cladding layer
4 active layer
5 second cladding layer
6 mesa structure
6*a* side surface
6*b* slope surface
6*c*, 6*d* bottom portion
7, 17 buried layer
7*a*, 7*d* first buried layer
7*b* second buried layer
7*c* third buried layer
7*f* transition plane
8 contact layer
9 surface protection film
10 first electrode
11 second electrode
12 metal plating film
20, 22 mask
20*a*, 22*a* $SiO_2$ film
21, 23 photoresist mask
23*a* photoresist film
27*a* side surface portion
27*b* slope portion
27*c*, 27*d* flat portion
100, 110, 120, 130, 140, 200 optical semiconductor device

The invention claimed is:

1. An optical semiconductor device comprising:

a first-conductivity-type semiconductor substrate having a projecting portion;

second-conductivity-type intermediate layers formed on both sides of the projecting portion above the semiconductor substrate;

a stripe-shaped mesa structure formed of a first-conductivity-type first cladding layer, an active layer, and a second-conductivity-type second cladding layer, which are laminated above a surface including a top of the projecting portion so as to be centered at the projecting portion;

buried layers formed on both sides of the mesa structure, to block current; and a second-conductivity-type contact layer formed at surfaces of the mesa structure and the buried layers, wherein a width between ends of the intermediate layers that contact with the projecting portion in a stripe width direction is greater than a width between ends of bottom portions of the mesa structure in the stripe width direction, the mesa structure has, on each of both sides thereof, a side surface along a direction perpendicular to a surface of the semiconductor substrate, a bottom portion on the intermediate layer side, and a slope surface connecting the side surface and the bottom portion, the buried layers are each formed of a second-conductivity-type or high-resistance first buried layer, a first-conductivity-type second buried layer, and a second-conductivity-type third buried layer, which are sequentially laminated on both sides of the mesa structure, and a distance from a part at which a plane along the side surface of the mesa structure and a plane where the intermediate layer contacts with the first buried layer cross each other, to an end on a side where the intermediate layer contacts with the first buried layer, is not less than a distance obtained by multiplying a distance from the plane where the intermediate layer contacts with the first buried layer to an upper end of the active layer by 0.708.

2. The optical semiconductor device according to claim 1, further comprising:

a surface protection film formed above the second-conductivity-type contact layer and having an opening;

a first electrode contacting with a surface of the second-conductivity-type contact layer via the opening of the surface protection film; and a second electrode formed on a back surface side of the first-conductivity-type semiconductor substrate.

3. The optical semiconductor device according to claim 1, wherein the first buried layer is formed of a side surface portion covering the side surface of the mesa structure, a slope portion covering the slope surface of the mesa structure, and a flat portion covering a surface of the intermediate layer.

4. The optical semiconductor device according to claim 2, wherein a layer thickness of the flat portion in the first buried layer is not less than two times a layer thickness of the side surface portion.

5. An optical semiconductor device production method comprising the steps of:

forming a projecting portion on a first-conductivity-type semiconductor substrate through etching;

epitaxially growing intermediate layers on both sides of the projecting portion;

sequentially epitaxially growing a first-conductivity-type first cladding layer, an active layer, and a second-conductivity-type second cladding layer at surfaces of the projecting portion and the intermediate layers;

forming, through etching, a stripe-shaped mesa structure whose center coincides with a center of the projecting portion and which is formed of the first cladding layer, the active layer, and the second cladding layer;

epitaxially growing buried layers for blocking current, on both sides of the mesa structure; and epitaxially growing a second-conductivity-type contact layer at surfaces of the mesa structure and the buried layers, wherein a width between ends of the intermediate layers that contact with the projecting portion in a stripe width direction is formed to be greater than a width between ends of bottom portions of the mesa structure in the stripe width direction, the mesa structure is formed to have, on each of both sides thereof, a side surface along a direction perpendicular to a surface of the semiconductor substrate, a bottom portion on the intermediate layer side, and a slope surface connecting the side surface and the bottom portion, the buried layers are each formed by three layers that are a second-conductivity-type or high-resistance first buried layer, a first-conductivity-type second buried layer, and a second-conductivity-type third buried layer, which are sequentially laminated on both sides of the mesa structure, and a distance from a part at which a plane along the side surface of the mesa structure and a plane where the intermediate layer contacts with the first buried layer cross each other, to an end on a side where the intermediate layer contacts with the first buried layer, is not less than a distance obtained by multiplying a distance from the plane where the intermediate layer contacts with the first buried layer to an upper end of the active layer by 0.708.

6. The optical semiconductor device production method according to claim 5, wherein etching is performed so that a sectional shape along a stripe width direction of the projecting portion becomes a rectangular shape or a trapezoidal shape.

* * * * *